United States Patent
Cheng et al.

(10) Patent No.: US 10,141,420 B1
(45) Date of Patent: Nov. 27, 2018

(54) TRANSISTORS WITH DIELECTRIC-ISOLATED SOURCE AND DRAIN REGIONS

(71) Applicant: INTERNATIONAL BUSINESS MACHINES CORPORATION, Armonk, NY (US)

(72) Inventors: Kangguo Cheng, Schenectady, NY (US); Choonghyun Lee, Rensselaer, NY (US); Juntao Li, Albany, NY (US); Peng Xu, Santa Clara, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/820,947

(22) Filed: Nov. 22, 2017

(51) Int. Cl.
| | |
|---|---|
| *H01L 29/66* | (2006.01) |
| *H01L 29/78* | (2006.01) |
| *H01L 21/82* | (2006.01) |
| *H01L 29/06* | (2006.01) |
| *H01L 29/08* | (2006.01) |
| *H01L 29/417* | (2006.01) |
| *H01L 21/8238* | (2006.01) |
| *H01L 21/8234* | (2006.01) |

(52) U.S. Cl.
CPC .......... *H01L 29/66636* (2013.01); *H01L 21/823425* (2013.01); *H01L 21/823814* (2013.01); *H01L 29/0649* (2013.01); *H01L 29/0653* (2013.01); *H01L 29/0843* (2013.01); *H01L 29/41783* (2013.01); *H01L 29/66643* (2013.01); *H01L 29/66696* (2013.01); *H01L 29/66795* (2013.01); *H01L 29/785* (2013.01); *H01L 29/7839* (2013.01); *H01L 29/7848* (2013.01); *H01L 29/7851* (2013.01)

(58) Field of Classification Search
CPC ....... H01L 29/66643; H01L 21/823814; H01L 21/823425; H01L 29/7848; H01L 29/66636; H01L 29/66696; H01L 29/0843; H01L 29/7839; H01L 29/41783; H01L 29/0649; H01L 29/0653; H01L 29/6675; H01L 29/785
See application file for complete search history.

(56) References Cited

U.S. PATENT DOCUMENTS

| | | | |
|---|---|---|---|
| 7,598,145 | B2 | 10/2009 | Damlencourt et al. |
| 7,851,790 | B2 | 12/2010 | Rachmady et al. |
| 8,048,723 | B2 | 11/2011 | Chang et al. |
| 8,211,761 | B2 | 7/2012 | Tan et al. |
| 8,623,728 | B2 | 1/2014 | Chang et al. |
| 9,171,715 | B2 | 10/2015 | Matero |

(Continued)

OTHER PUBLICATIONS

Chao, "Bottom Channel Isolation in Nanosheet Transistors", U.S. Appl. No. 14/493,730, filed Apr. 21, 2017, 36 pages.

(Continued)

*Primary Examiner* — Thanhha Pham
(74) *Attorney, Agent, or Firm* — Tutunjian & Bitetto, P.C.; Vazken Alexanian

(57) ABSTRACT

Semiconductor devices and method of forming the same include forming a sacrificial layer on source/drain regions of a semiconductor layer. A reactant layer is formed on the sacrificial layer. The reactant layer and sacrificial layer are annealed to convert the reactant layer to a dielectric layer. Source and drain regions are formed on the dielectric layer.

9 Claims, 10 Drawing Sheets

(56) References Cited

U.S. PATENT DOCUMENTS

2011/0024804 A1* 2/2011 Chang ................ H01L 29/7848
257/288
2013/0316513 A1 11/2013 Basker et al.

OTHER PUBLICATIONS

Chui, "Source/Drain Germanium Condensation for P-Channel Strained Ultra-Thin Body Transistors", Silicon Nano Device Lab, Dept. of Electrical and Computer Engineering, National University of Singapore; IEEE Dec. 2005, p. 493-496.

Wang, "Desorption Kinetics of GeO from GeO2/Ge Structure", J. Appl. Phys. 108, 054104, Sep. 2010, 8 pages.

* cited by examiner

TRANSISTORS WITH DIELECTRIC-ISOLATED SOURCE AND DRAIN REGIONS

BACKGROUND

Technical Field

The present invention generally relates to transistor design and fabrication and, in particular, to transistors having dielectric isolation of source/drain regions on bulk-semiconductor substrates.

Description of the Related Art

Field effect transistors (FETs) can be formed on both semiconductor-on-insulator (SOI) and bulk-semiconductor substrates. However, devices formed on bulk-semiconductor substrates have more parasitic capacitance than SOI substrates due to junction capacitance. Furthermore, junction leakage current is a significant concern when operating on bulk-semiconductor substrates, as currents can take paths deep in the substrate. These concerns apply to both fin FETs and planar FETs.

SUMMARY

A method of forming a semiconductor device includes forming a sacrificial layer on source/drain regions of a semiconductor layer. A reactant layer is formed on the sacrificial layer. The reactant layer and sacrificial layer are annealed to convert the reactant layer to a dielectric layer. Source and drain regions are formed on the dielectric layer.

A planar semiconductor device includes a bulk semiconductor substrate having a channel region and source/drain regions. A gate stack is formed on the channel region of the bulk semiconductor substrate. A dielectric layer is formed in recesses in the source/drain regions of the bulk semiconductor substrate. Source/drain structures are formed over the dielectric layer in the source/drain regions of the bulk semiconductor substrate.

A fin semiconductor device includes a fin formed from a bulk semiconductor substrate. The fin includes a channel region and source/drain regions. A gate stack is formed on the channel region of the fin. A dielectric layer is formed on the source/drain regions of the fin. Source/drain structures are formed over the dielectric layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention use dielectric liners formed beneath the source/drain regions of field effect transistors (FETs) to reduce junction capacitance and off-state junction leakage currents from the source/drain junction. Not only do the dielectric liners prevent leakage currents directly, they also prevent out-diffusion of dopants from the source/drain regions that might create new parasitic leakage paths.

The present embodiments include both fin FETs and planar FETs and both n-type FETs and p-type FETs. It is specifically contemplated that the dielectric liners may be formed using the reaction of germanium dioxide with silicon germanium, causing the germanium to be separated out and leaving silicon dioxide behind.

Figure 1:
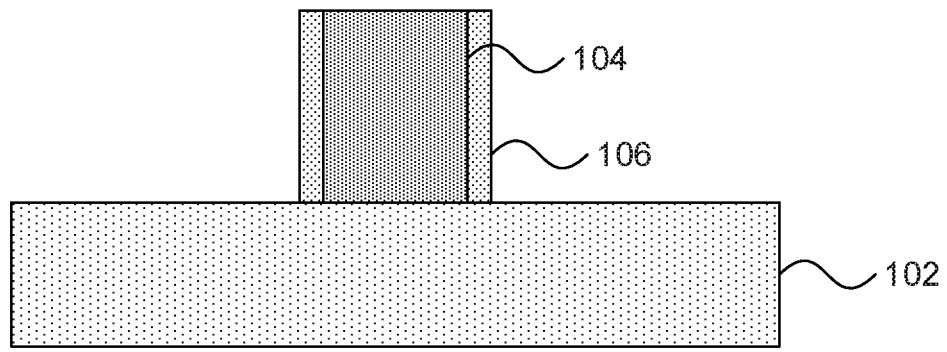
FIG. 1 is a cross-sectional diagram illustrating a step in the formation of a field effect transistor (FET) having dielectric-lined source and drain regions, where a dummy gate is formed on a semiconductor substrate, in accordance with an embodiment of the present invention.

Referring now to FIG. 1, a cross-sectional diagram of a step in the formation of a planar FET is shown. A planar FET is characterized by the transistor's channel having a conduction path that is within the substrate itself. A semiconductor substrate 102 is shown and is specifically contemplated as being formed from a bulk semiconductor material. A dummy gate 104 is formed on the surface of the semiconductor substrate, with spacers 106 being formed on sidewalls of the dummy gate 104.

In one example, the bulk-semiconductor substrate 102 may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide.

It is specifically contemplated that the dummy gate 104 may be formed from polycrystalline silicon, though it should be understood that any material having appropriate etch selectivity may be used instead. The dielectric spacers 106 may be formed from a dielectric material such as, e.g., silicon nitride. As used herein, the term "selective" in reference to a material removal process denotes that the rate of material removal for a first material is greater than the rate of removal for at least another material of the structure to which the material removal process is being applied. In some embodiments, etch selectivity may denote that an etch rate of one material under the etch in question is at least ten times greater than an etch rate for another material under the same etch.

Figure 2:
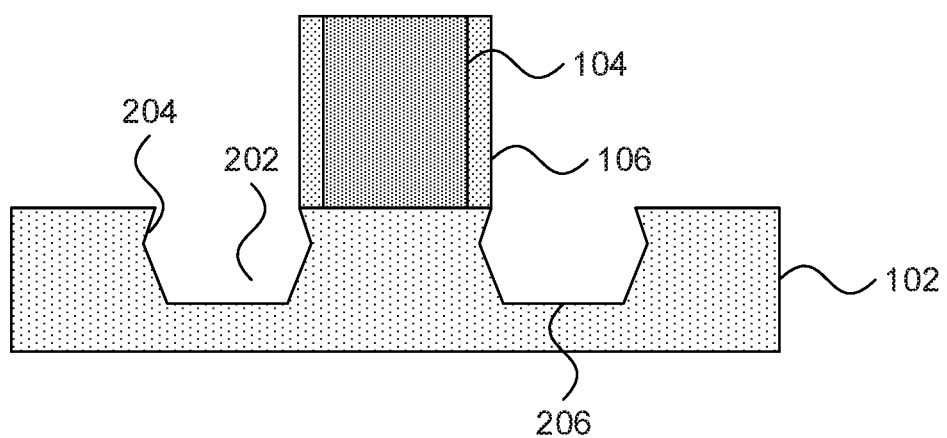
FIG. 2 is a cross-sectional diagram illustrating a step in the formation of a FET having dielectric-lined source and drain regions, where recesses are formed at sides of the dummy gate, in accordance with an embodiment of the present invention.

Referring now to FIG. 2, a cross-sectional diagram of a step in the formation of a planar FET is shown. Source/drain recesses 202 are formed on respective sides of the dummy gate 104. The source/drain recesses 202 may, in some embodiments, be formed by a selective anisotropic etch followed by a selective wet or dry chemical etch to widen the hole created by the anisotropic etch. The source/drain recesses 202 that result have facets 204 that include a crystalline orientation of, e.g., <111>, while bottom surfaces 206 have a crystalline orientation of, e.g., <100>. It is specifically contemplated that, for a silicon substrate, the second etch may be a dilute hydrofluoric acid etch, a potassium hydroxide etch, or a tetramethyl ammonium hydroxide etc.

Crystalline orientation refers to the ordered arrangement atoms in a particular crystal structure along a given surface. In one example, silicon forms a "face-centered diamond-cubic" crystal structure, and cutting a silicon crystal along different planes will result in differing patterns of atoms being presented along the surface that is produced. These patterns are identified with Miller indices (e.g., <100>, <111>, etc.), with different Miller indices corresponding to different crystalline orientations. Different crystalline orientations will have different properties during certain processes, such as etches and epitaxial growth.

The anisotropic etch may include a reactive ion etch (RIE). RIE is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

Figure 3:
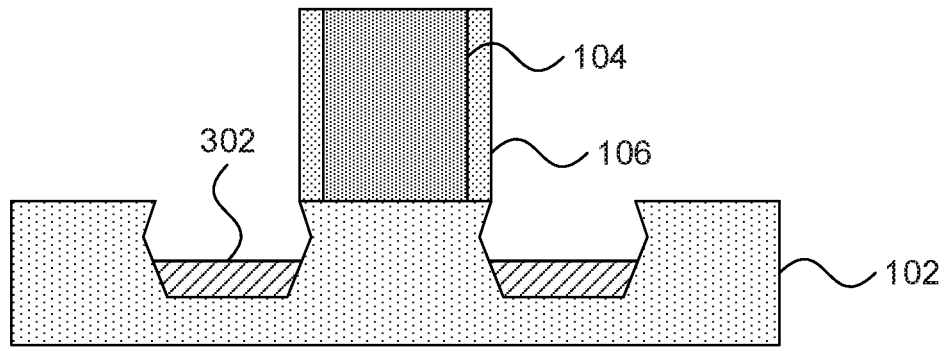
FIG. 3 is a cross-sectional diagram illustrating a step in the formation of a FET having dielectric-lined source and drain regions, where a sacrificial layer is formed in the recesses, in accordance with an embodiment of the present invention.

Referring now to FIG. 3, a cross-sectional diagram of a step in the formation of a planar FET is shown. A sacrificial layer 302 is epitaxially grown from bottom surfaces 206 of the source/drain recesses 202. It is specifically contemplated that the sacrificial layer 302 will be formed from silicon germanium, with an exemplary germanium concentration range of between about 20% and about 70%, with a specific exemplary concentration of about 40%, though it should be understood that other materials and other concentrations may be used instead. In some embodiments the sacrificial layer will have a thickness between about 4 nm and about 10 nm.

The terms "epitaxial growth" means the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a crystal surface having a <100> crystalline orientation will take on a <100> crystalline orientation.

An epitaxial growth process may cause material to grow significantly faster on surfaces with a <100> crystalline orientation than on surfaces with a <111> crystalline orientation. As a result, the bottom surfaces 206 of the source/drain recesses 202 will accumulate significantly more sacrificial material than the facets 204. Any material that does grown on the facets 204 can then be removed by a short etch-back that leaves the majority of the sacrificial material on the bottom surfaces 206 intact.

It should be noted that, although these structures are not shown in the present figures for the sake of simplicity, the space on substrate's surface around the source/drain recesses 202 will have other structures, such as dummy gates, blocking that space. Thus, the epitaxial growth process does not reach the top surface of the substrate 102 and additional material does not grow from the top of the substrate 102.

Figure 4:
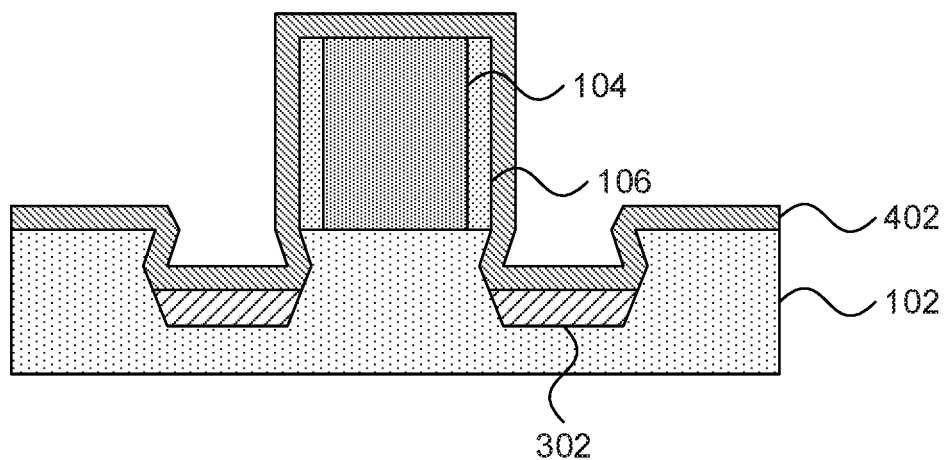
FIG. 4 is a cross-sectional diagram illustrating a step in the formation of a FET having dielectric-lined source and drain regions, where a reactant layer is formed over the sacrificial layer, in accordance with an embodiment of the present invention.

Referring now to FIG. 4, a cross-sectional diagram of a step in the formation of a planar FET is shown. A reactant layer 402 is deposited over the layer of sacrificial material 302 and other surfaces of the device. It is specifically contemplated that the reactant layer 402 may be formed from, e.g., germanium dioxide and may be deposited by atomic layer deposition (ALD), but any appropriate deposition process may be used instead, such as chemical vapor deposition (CVD), physical vapor deposition (PVD), or gas-cluster ion beam (GCIB) deposition. The reactant layer 402 may be deposited with an exemplary thickness ranging between about 3 nm and about 10 nm.

CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Figure 5:
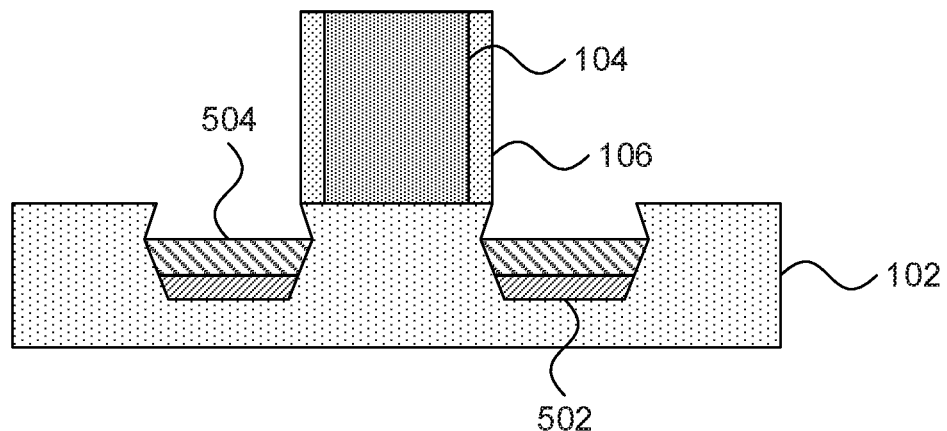
FIG. 5 is a cross-sectional diagram illustrating a step in the formation of a FET having dielectric-lined source and drain regions, where an anneal is performed to form a dielectric liner, in accordance with an embodiment of the present invention.

Referring now to FIG. 5, a cross-sectional diagram of a step in the formation of a planar FET is shown. The chemistry of the sacrificial layer 302 and the reactant layer 402 are selected such that, when an anneal is performed, a reaction between the reactant layer 402 and the sacrificial layer 302 creates a dielectric layer 504. In the specific case of a silicon germanium sacrificial layer 302 and a germanium dioxide reactant layer 402, silicon diffuses out of the germanium dioxide layer 402 and into layer 302, replacing the germanium there to form a layer of pure silicon dioxide 504. The germanium that is freed from the germanium dioxide layer 402 is released as gaseous germanium oxide (GeO). Any unreacted germanium dioxide material from layer 402 may then be etched away using, e.g., a wash in deionized water.

In one specific embodiment, the anneal may be performed at about 600° C. in a nitrogen gas ambient environment. It should be understood that the anneal temperature is strongly dependent on the composition of the sacrificial layer 302. In embodiments where silicon germanium is used for the sacrificial layer 302 and the germanium concentration is in the range between about 20% and about 70%, the anneal may be performed at a temperature in the range between about 750° C. and about 450° C. To accelerate the reaction of the reactant layer 402 and the sacrificial layer 302, a redox has ambient may be used. In the case of germanium dioxide in the reactant layer 402 and silicon germanium in the sacrificial layer 302, such redox gases may include hydrogen, hydrogen/helium, nitrogen/helium, and argon/helium. A vacuum may also be used.

Figure 6:
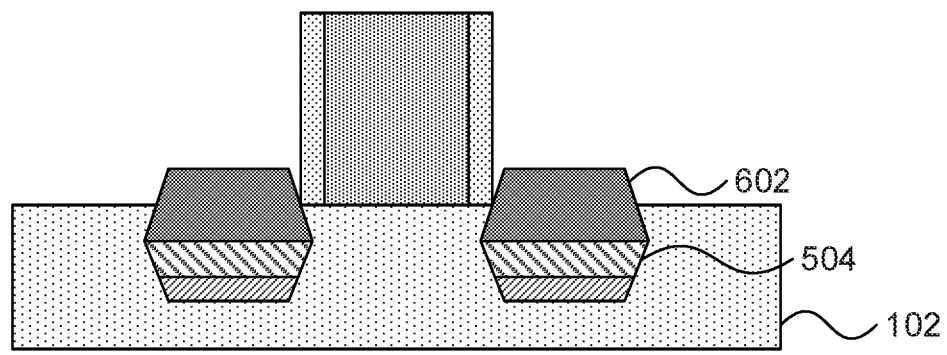
FIG. 6 is a cross-sectional diagram illustrating a step in the formation of a FET having dielectric-lined source and drain regions, where source and drain regions are formed in the recesses, in accordance with an embodiment of the present invention.

Referring now to FIG. 6, a cross-sectional diagram of a step in the formation of a planar FET is shown. Source and drain regions 602 are epitaxially grown in the source/drain recesses 202. The source and drain regions 602 are partially isolated from the semiconductor substrate 102 by the dielectric regions 504. The source and drain regions 602 may be grown to a height that extends beyond the top surface of the semiconductor substrate 102.

The source and drain regions 602 may be in situ doped with an appropriate dopant type. As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium. As used herein, "n-type" refers to the addition of impurities that contributes free electrons to an intrinsic semiconductor in a silicon containing substrate examples of n-type dopants, i.e., impurities, include but are not limited to antimony, arsenic and phosphorous. The dopant type defines the type of transistor that is created, with n-type dopants being used in the source and drain regions of n-type FETs and with p-type dopants being used in the source and drain regions of p-type FETs.

Figure 7:
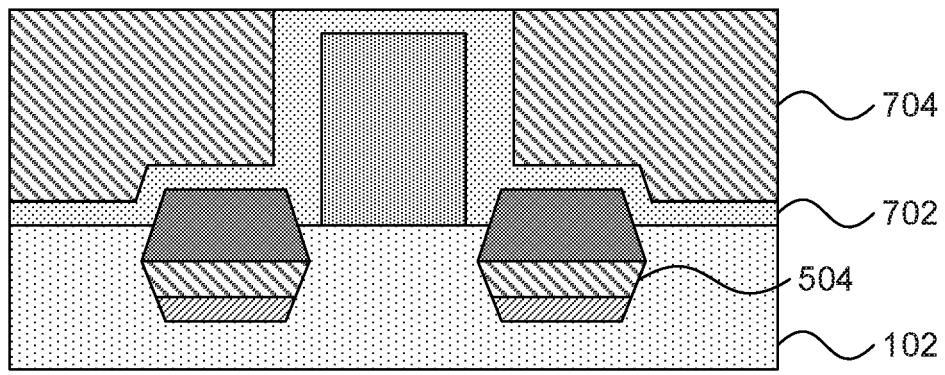
FIG. 7 is a cross-sectional diagram illustrating a step in the formation of a FET having dielectric-lined source and drain regions, where dielectric structures are formed over the source and drain regions, in accordance with an embodiment of the present invention.

Referring now to FIG. 7, a cross-sectional diagram of a step in the formation of a planar FET is shown. A liner 702 is conformally deposited using, for example, CVD, PLV, or ALD, and may be formed from an appropriate dielectric material such as, e.g., silicon nitride. An inter-layer dielectric 704 is then deposited by any appropriate process such as, e.g., CVD, PVD, ALD, GCIB deposition, or a spin-on flowable oxide process and may be formed from, e.g., silicon dioxide. The inter-layer dielectric 704 may then be polished down using, for example, a chemical mechanical planarization (CMP) process that stops on the material of the liner 702.

CMP is performed using, e.g., a chemical or granular slurry and mechanical force to gradually remove upper layers of the device. The slurry may be formulated to be unable to dissolve, for example, the silicon nitride of the liner 702, resulting in the CMP process's inability to proceed any farther than that layer.

Figure 8:
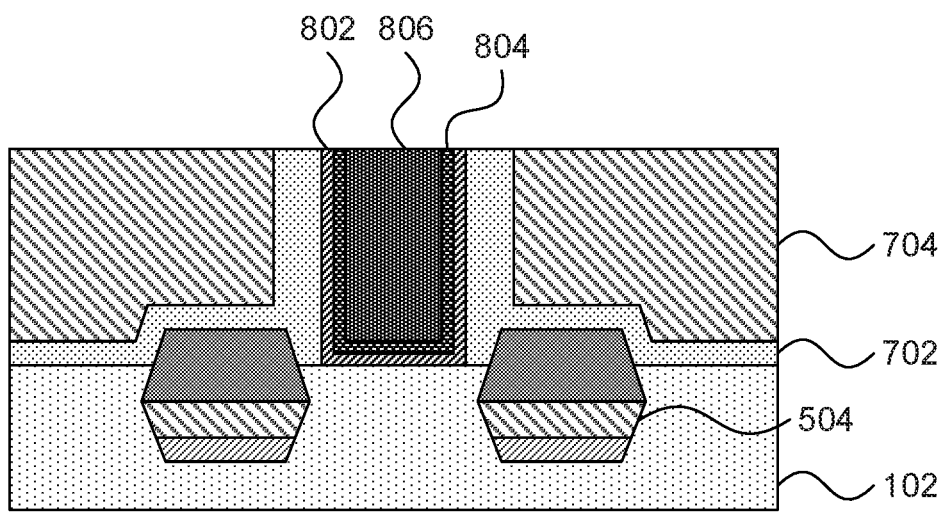
FIG. 8 is a cross-sectional diagram illustrating a step in the formation of a FET having dielectric-lined source and drain regions, where the dummy gate is replaced with a final gate stack, in accordance with an embodiment of the present invention.

Referring now to FIG. 8, a cross-sectional diagram of a step in the formation of a planar FET is shown. The dummy gate 104 is removed and a gate stack is deposited in its place. The gate stack includes a gate dielectric 802, an optional work function metal 804, and a gate conductor 806.

The gate dielectric 802 may be formed from, e.g., a high-k dielectric material. As used herein, the term "high-k" means a material having a dielectric constant that is greater than silicon dioxide at room temperature (e.g., about 20° C. to about 25° C.) and atmospheric pressure (e.g., about 1 atm). Examples of high-k dielectric materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric material may further include dopants such as lanthanum and aluminum.

The work function metal layer 804 may be formed from an n-type or a p-type work function metal, as appropriate to the device being formed. The work function metal layer may be deposited by a PVD process, such as sputtering, CVD, or ALD.

As used herein, a "p-type work function metal layer" is a metal layer that effectuates a p-type threshold voltage shift. In one embodiment, the work function of the p-type work function metal layer ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. In one embodiment, a p-type work function metal layer may be formed from titanium nitride, titanium aluminum nitride, ruthenium, platinum, molybdenum, cobalt, and alloys and combinations thereof.

As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV. In one embodiment, the n-type work function metal layer is formed from at least one of titanium aluminum, tantalum nitride, titanium nitride, hafnium nitride, hafnium silicon, or combinations thereof. It should be understood that titanium nitride may play the role of an n-type work function metal or a p-type work function metal, depending on the conditions of its deposition.

The gate conductor 806 may be formed from any appropriate conductive metal such as, e.g., tungsten, nickel, titanium, molybdenum, tantalum, copper, platinum, silver, gold, ruthenium, iridium, rhenium, rhodium, and alloys thereof. The gate conductor 806 may alternatively be formed from a doped semiconductor material such as, e.g., doped polysilicon.

Figure 9:
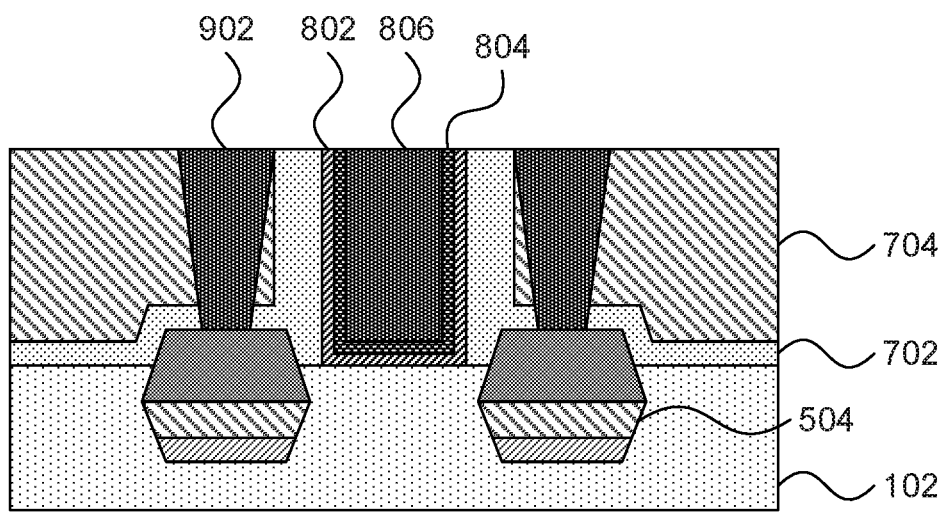
FIG. 9 is a cross-sectional diagram illustrating a step in the formation of a FET having dielectric-lined source and drain regions, where source and drain contacts are formed, in accordance with an embodiment of the present invention.

Referring now to FIG. 9, a cross-sectional diagram of a step in the formation of a planar FET is shown. An anisotropic etch is used to etch holes down through the inter-layer dielectric 704 and the liner 702 to reach the source/drain regions 602. Source/drain contacts 902 are then formed in the holes, providing electrical connectivity to the source/drain regions, completing the device.

Figure 10:
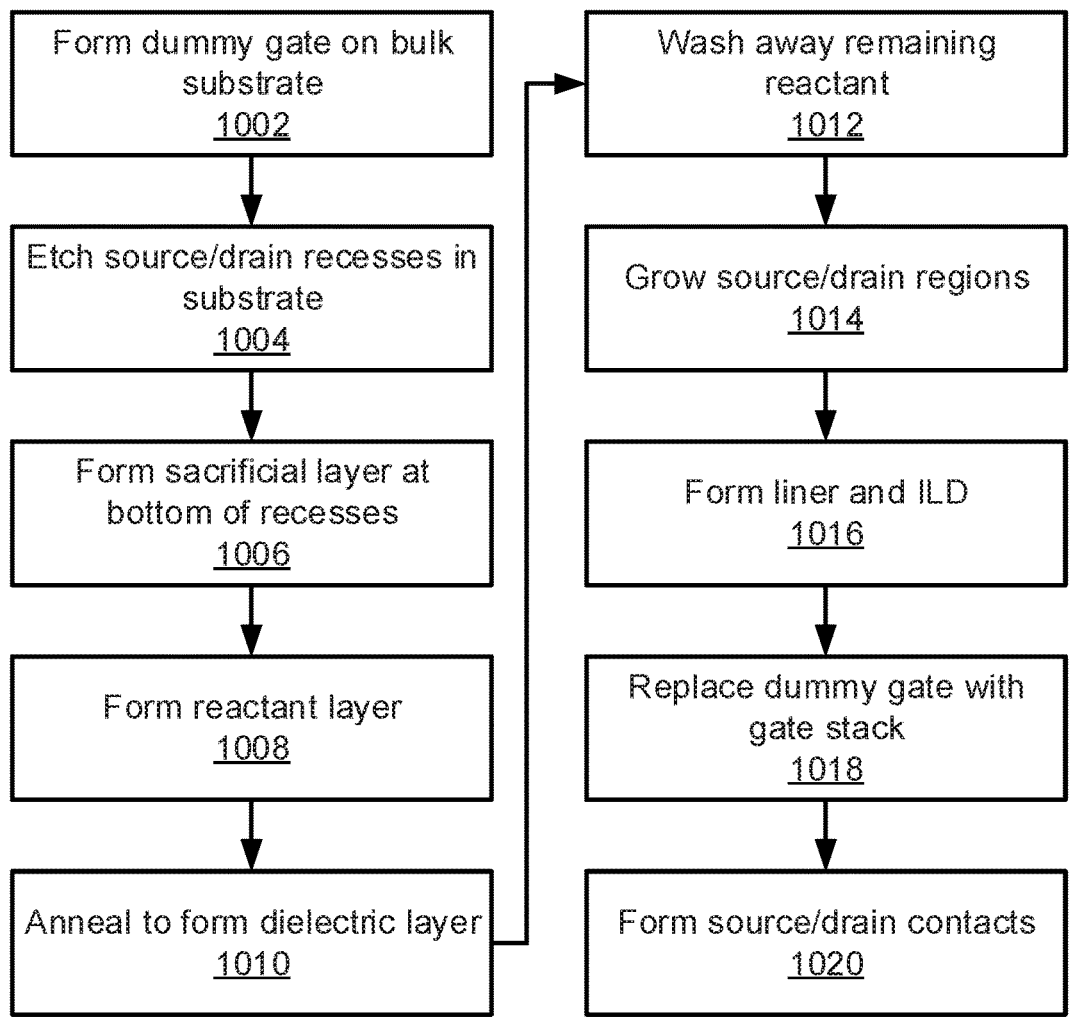
FIG. 10 is a block/flow diagram of a method of forming a planar FET having dielectric-lined source and drain regions in accordance with an embodiment of the present invention.

Referring now to FIG. 10, a method of forming a planar FET is shown. Block 1002 forms a dummy gate 104 on a bulk semiconductor substrate 102. This may be performed by any appropriate patterning process including, e.g., photolithography. Block 1004 etches source and drain recesses 202 into the substrate 102 on opposite sides of the dummy gate 104. The formation of the source and drain recesses 202 may be accomplished using an initial anisotropic etch, followed by an isotropic etch that partially undercuts at least spacers 106.

Block 1006 forms sacrificial layer 302 at the bottom surface 206 of the source/drain recesses 202. This may be accomplished by epitaxially growing sacrificial material, such as silicon germanium with a germanium concentration of about 40%, on the exposed substrate surfaces. The bottom surface 206 of the recesses 202 may have a crystalline orientation that promotes faster growth than the facets 204 (e.g., having an orientation of <100> versus <111>), and an isotropic etch is then used to remove the relatively small amount of sacrificial material from the facets 204.

Block 1008 forms a reactant layer 402 on the sacrificial layer 302 by any appropriate deposition process. The reactant layer may be formed from, e.g., germanium dioxide.

Block 1010 performs an anneal to form dielectric layer 504. The anneal drives silicon from the sacrificial layer 302 into the reactant layer 402 where it replaces the germanium to form dielectric layer 504. The germanium released from the reactant layer 402 escapes as gaseous germanium oxide. Block 1012 then washes away the remaining reactant layer which, in the case of germanium dioxide, is water-soluble.

Block 1014 then epitaxially grows source/drain regions 602 on the dielectric layer 504. The source/drain regions 602 may be in situ doped and may be formed from any appropriate semiconductor material such as, e.g., doped silicon. Block 1016 forms liner 702 and inter-layer dielectric over the source/drain regions 602 and the dummy gate 104. Block 1020 then forms the source/drain contacts 902 to complete the transistor device.

Figure 11:
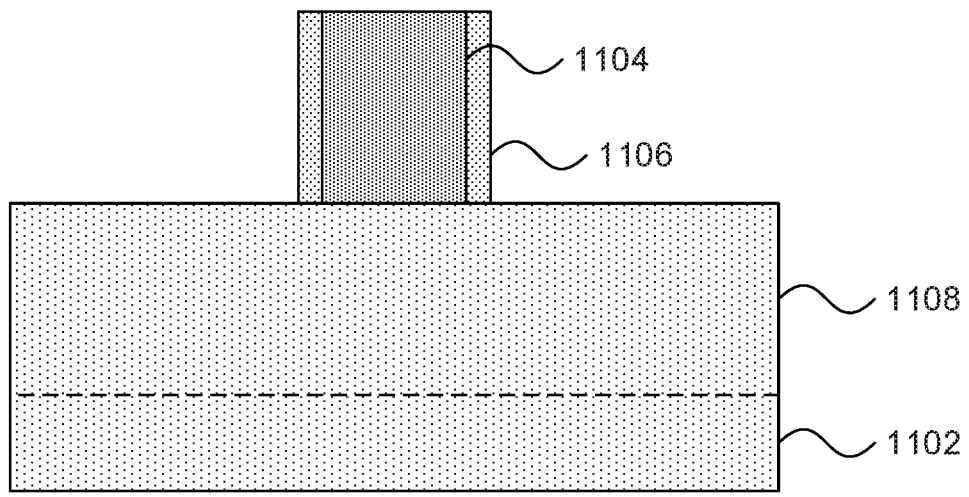
FIG. 11 is a cross-sectional diagram illustrating a step in the formation of a FET having dielectric-lined source and drain regions, where a dummy gate is formed on a semiconductor fin, in accordance with an embodiment of the present invention.

Referring now to FIG. 11, a cross-sectional diagram of a step in the formation of a fin FET is shown. As with the planar FET step shown in FIG. 1, a dummy gate 1104 and dummy gate spacers 1106 are formed over a bulk semiconductor substrate 1102. In this case, however, a fin 1108 is formed from the substrate 1102. The fin 1108 may be formed by, e.g., an anisotropic etch such as RIE or any of the other anisotropic processes described above, and may be separated from other structures by a shallow-trench isolation that deposits dielectric material between such structures. In this and subsequent views, the cross-section is shown as being parallel with the fin's length, with the fin 1108 having a relatively narrow width in the direction perpendicular to the page. A dashed line illustrates for this figure where the base of the fin 1108 is relative to the bulk substrate 1102. It should be understood that, where not otherwise specified, the processes, materials, and structures used in the formation of the fin FET may be the same as those described above with respect to the formation of planar FETs.

Figure 12:
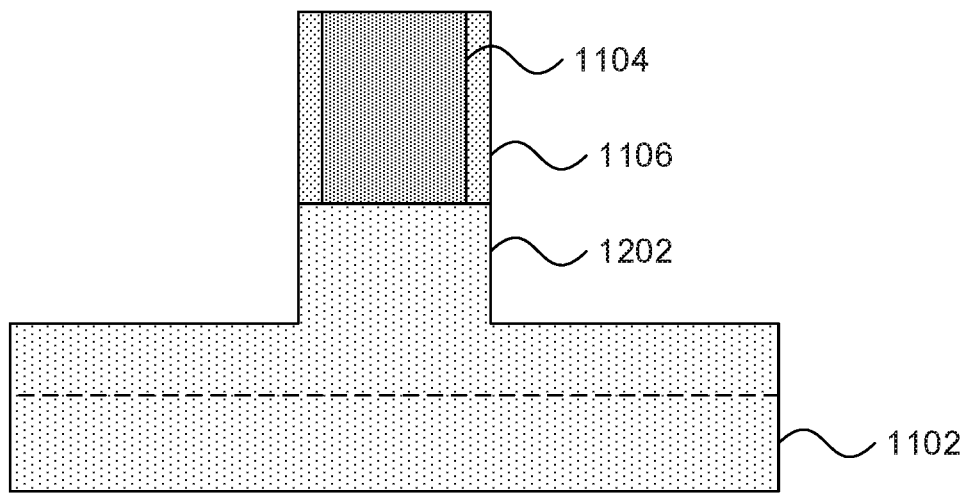
FIG. 12 is a cross-sectional diagram illustrating a step in the formation of a FET having dielectric-lined source and drain regions, where source and drain regions of the semiconductor fin are etched back, in accordance with an embodiment of the present invention.

Referring now to FIG. 12, a cross-sectional diagram of a step in the formation of a fin FET is shown. The fin 1108 is etched partially down using the dummy gate 1104 and spacer 1106 as a mask. It is specifically contemplated that the fin 1108 may be etched down to a point that is somewhat below the top surface of the shallow-trench isolation structures, but it should be understood that any appropriate fin height may be used. The etch leaves behind a channel region 1202 underneath the dummy gate 1104.

Figure 13:
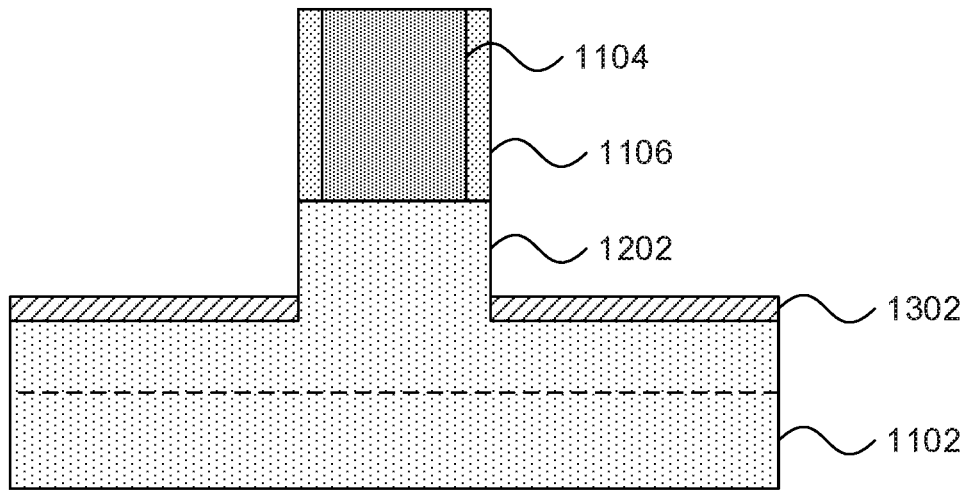
FIG. 13 is a cross-sectional diagram illustrating a step in the formation of a FET having dielectric-lined source and drain regions, where a sacrificial layer is formed on the source and drain regions of the semiconductor fin, in accordance with an embodiment of the present invention.

Referring now to FIG. 13, a cross-sectional diagram of a step in the formation of a fin FET is shown. A layer of sacrificial material 1302 is formed by epitaxial growth and may be formed from, e.g., silicon germanium having a germanium concentration of about 40%.

Figure 14:
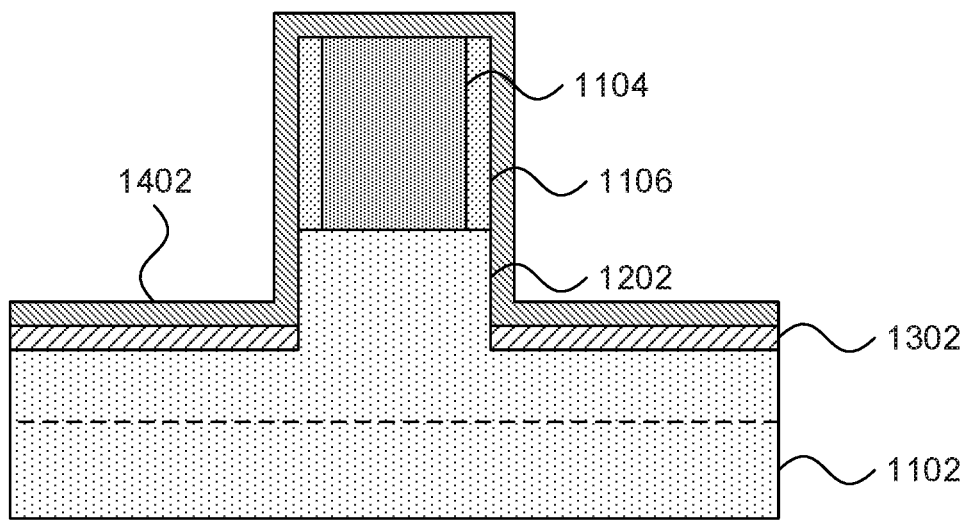
FIG. 14 is a cross-sectional diagram illustrating a step in the formation of a FET having dielectric-lined source and drain regions, where a reactant layer is formed over the sacrificial layer, in accordance with an embodiment of the present invention.

Referring now to FIG. 14, a cross-sectional diagram of a step in the formation of a fin FET is shown. A reactant layer 1402 is deposited over the sacrificial layer 1302 by any appropriate deposition process and may be formed from, e.g., germanium dioxide.

Figure 15:
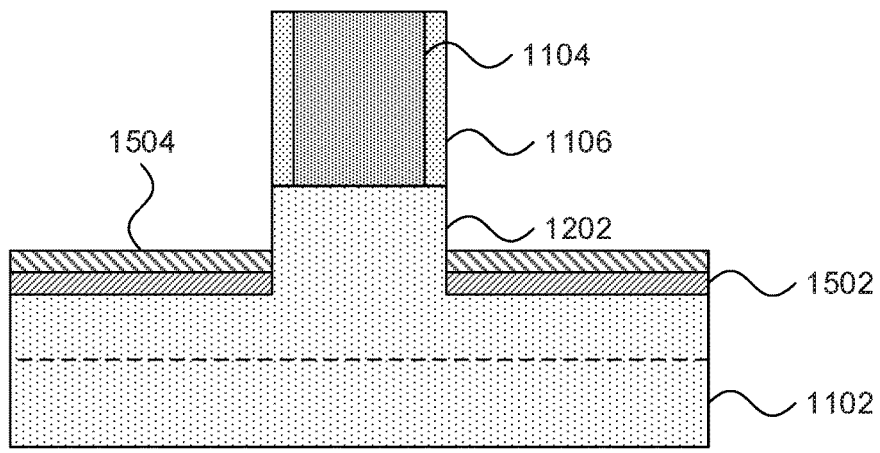
FIG. 15 is a cross-sectional diagram illustrating a step in the formation of a FET having dielectric-lined source and drain regions, where an anneal is performed to form a dielectric liner, in accordance with an embodiment of the present invention.

Referring now to FIG. 15, a cross-sectional diagram of a step in the formation of a fin FET is shown. An anneal is performed that causes the reactant layer 1402 to react with the sacrificial layer 1302 to form dielectric layer 1504 and depleted sacrificial layer 1502. The dielectric layer 1504 may thus be formed from pure silicon dioxide and the depleted sacrificial layer may have a germanium concentration of about 60%. Unreacted remnants of the reactant layer 1402 may be washed away using, in the case of germanium dioxide, deionized water or any other suitable process.

Figure 16:
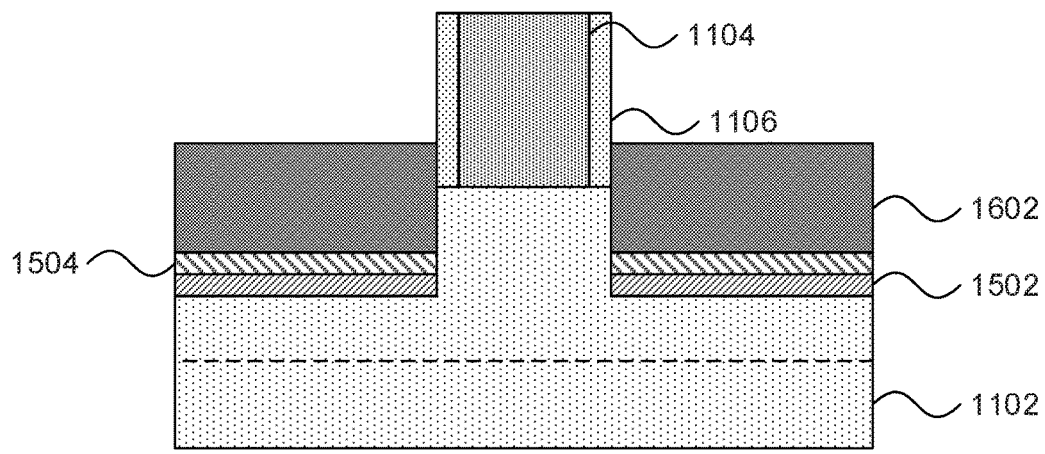
FIG. 16 is a cross-sectional diagram illustrating a step in the formation of a FET having dielectric-lined source and drain regions, where source and drain structures are formed on the dielectric liner, in accordance with an embodiment of the present invention.

Referring now to FIG. 16, a cross-sectional diagram of a step in the formation of a fin FET is shown. Source and drain regions 1602 are epitaxially grown over the dielectric layer 1504, which insulates the source and drain regions 1602 from the bulk substrate 1102. After formation of the source/drain regions, an appropriate inter-layer dielectric and source/drain contacts (not shown) may also be formed to complete the device.

Figure 17:
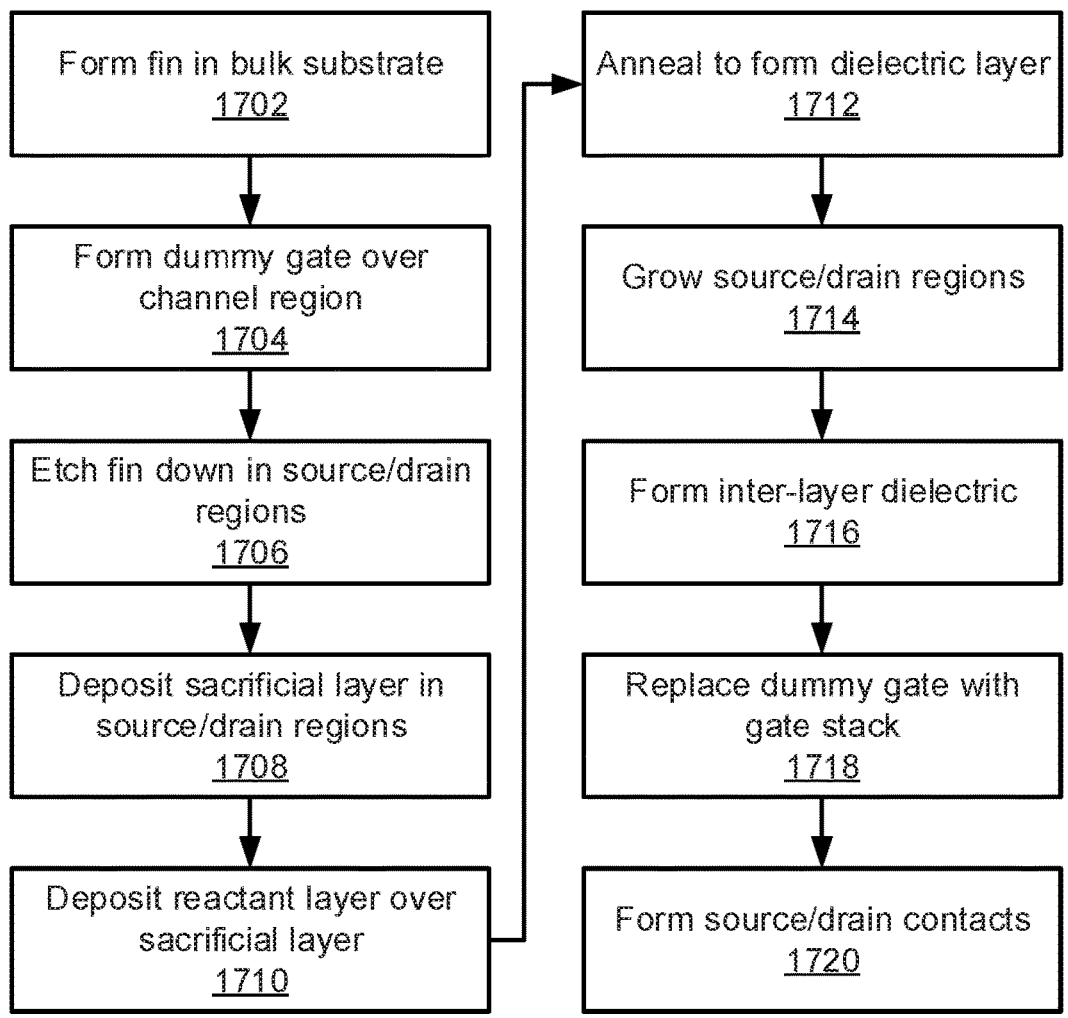
FIG. 17 is a block/flow diagram of a method of forming a fin FET having dielectric-lined source and drain regions in accordance with an embodiment of the present invention.

Referring now to FIG. 17, a method of forming a fin FET is shown. Block 1702 forms a fin 1108 in a bulk substrate 1702 using any appropriate process including, e.g., photolithography with an anisotropic etch or sidewall image transfer. Block 1704 then forms dummy gate 1104 and spacers 1106 over the channel region 1202 of the fin 1108 and block 1706 etches the fin 1108 down in source and drain regions around the dummy gate 1104.

Block 1708 forms sacrificial layer 1302 on the source and drain regions of the etched fin, with a particular embodiment epitaxially growing silicon germanium at a germanium concentration of about 40% for the sacrificial layer 1302. Block 1710 deposits the reactant layer 1402 over the sacrificial layer 1710, where the reactant layer may be formed from germanium dioxide. As in the planar FET embodiment, block 1712 performs an anneal at, e.g., about 600° C. in a gaseous nitrogen environment to form dielectric layer 1502.

Block 1714 grows source/drain regions 1602 using an in situ doped epitaxial growth process. Block 1716 then forms an inter-layer dielectric (not shown) over and around the fin and source/drain regions, which may include a deposition of the inter-layer dielectric material and a CMP process down to the level of the dummy gate 1104. Block 1718 then replaces the dummy gate 1104 with a gate stack (not shown), including a gate dielectric, an optional work function metal, and a gate conductor. Block 1720 forms source/drain contacts (not shown) by etching holes through the inter-layer dielectric and depositing an appropriate conductive contact material.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. it will be understood that the spatially relative terms are intended to encompass different orientations of the device in use or operation in addition to the orientation depicted in the FIGS. For example, if the device in the FIGS. is to over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of transistors with dielectric-isolated source and drain regions (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a semiconductor device, comprising:
    forming a sacrificial layer on source/drain regions of a semiconductor layer;
    forming a reactant layer on the sacrificial layer;
    annealing the reactant layer and the sacrificial layer to convert the reactant layer to a dielectric layer; and
    forming source and drain regions on the dielectric layer.

2. The method of claim 1, wherein the semiconductor layer is a top surface of a bulk semiconductor substrate.

3. The method of claim 2, further comprising forming source/drain recesses in the source/drain regions of the semiconductor layer, wherein forming the sacrificial layer comprises forming the sacrificial layer on only a bottom surface of the source/drain recesses.

4. The method of claim 1, wherein the semiconductor layer is a fin formed from a bulk semiconductor substrate.

5. The method of claim 1, wherein the sacrificial layer is formed from silicon germanium and the reactant layer is formed from germanium dioxide.

6. The method of claim 5, wherein annealing the reactant layer and sacrificial layer comprises heating the reactant layer and sacrificial layer to about 600° C. in a gaseous nitrogen environment.

7. The method of claim 5, wherein the dielectric layer is a silicon dioxide layer.

8. The method of claim 1, wherein forming the sacrificial layer comprises epitaxially growing the sacrificial layer from the source/drain regions of the semiconductor layer.

9. The method of claim 1, wherein only part of the reactant layer is converted, further comprising washing away remaining material from the reactant layer.

* * * * *